United States Patent [19]

Inotsume

[11] Patent Number: 5,038,401
[45] Date of Patent: Aug. 6, 1991

[54] TRANSMITTER FOR REMOTE CONTROL WITH OPERATION SWITCHES HAVING CHANGEABLY DISPLAYED FORMS

[75] Inventor: Fusako Inotsume, Tokyo, Japan
[73] Assignee: Pioneer Electronic Corporation, Tokyo, Japan
[21] Appl. No.: 501,984
[22] Filed: Mar. 30, 1990
[30] Foreign Application Priority Data Apr. 5, 1989 [JP] Japan .................................. 1-40183

[51] Int. Cl.⁵ ......................... H04B 1/02; H04N 5/44
[52] U.S. Cl. .................................... 455/92; 455/154; 455/352; 340/712; 341/23; 358/194.1
[58] Field of Search .................... 455/92, 95, 100, 151, 455/154, 158, 352, 355, 603; 340/712, 722, 723; 341/23; 358/194.1

[56] References Cited

U.S. PATENT DOCUMENTS

| 4,728,936 | 3/1988 | Guscott et al. ........................ 340/525 |
| 4,755,883 | 7/1988 | Uehira ................................. 358/335 |
| 4,825,200 | 4/1989 | Evans et al. .......................... 341/23 |

FOREIGN PATENT DOCUMENTS

| 0000648 | 1/1980 | Japan .................................. 455/158 |
| 0060628 | 4/1984 | Japan .................................. 340/712 |
| 0138891 | 5/1989 | Japan .................................. 455/603 |

Primary Examiner—Reinhard J. Eisenzopf
Assistant Examiner—Chi H. Pham
Attorney, Agent, or Firm—Sughrue, Mion, Zinn, Macpeak & Seas

[57] ABSTRACT

In the transmitter for remote control, a frequency at which an individual key switch is operated is counted, and a display formation of operation contents corresponding to the individual key switches is changed in accordance with the frequency. The changed operation contents are displayed by a display panel. The display formation includes the size, density, color, and sequence of operation menu displayed in the display panel. By using a transparent touch panel type display panel, an arrangement formation of the individual key switches can also be changed in accordance with the frequency at which they are used. The arrangement formation of the individual key switches includes the size and sequence of the individual key switches. In this way, an operator can easily find the operation menu on the display panel and easily operate key switches corresponding to frequently used key switches.

7 Claims, 13 Drawing Sheets

FIG. 3
FIG. 9
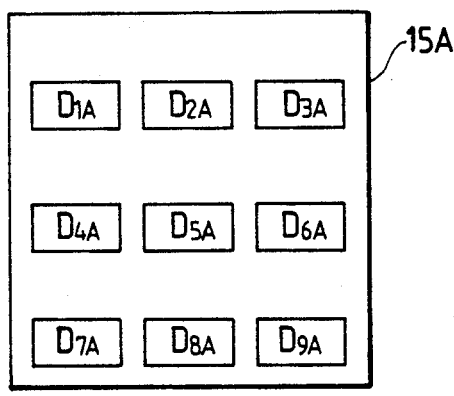
FIG. 6(A)
INITIAL DISPLAY
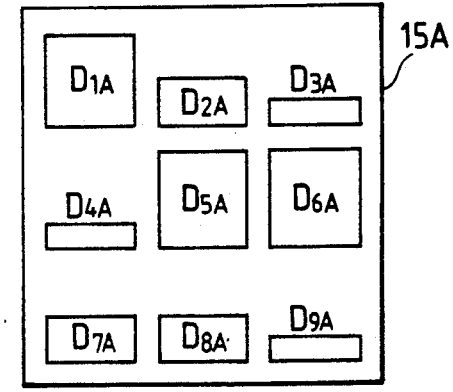
FIG. 6(B)
AFTER OPERATION SWITCH
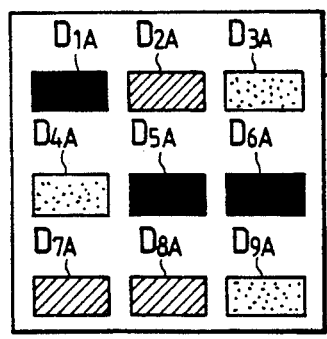
FIG. 7(A)
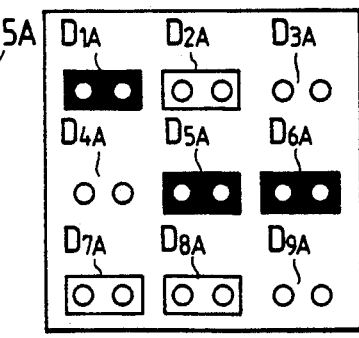
FIG. 7(B)
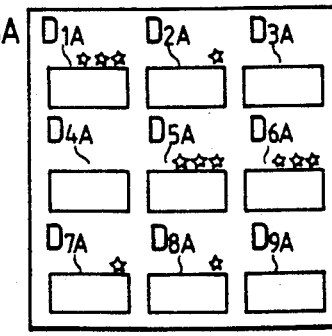
FIG. 7(C)

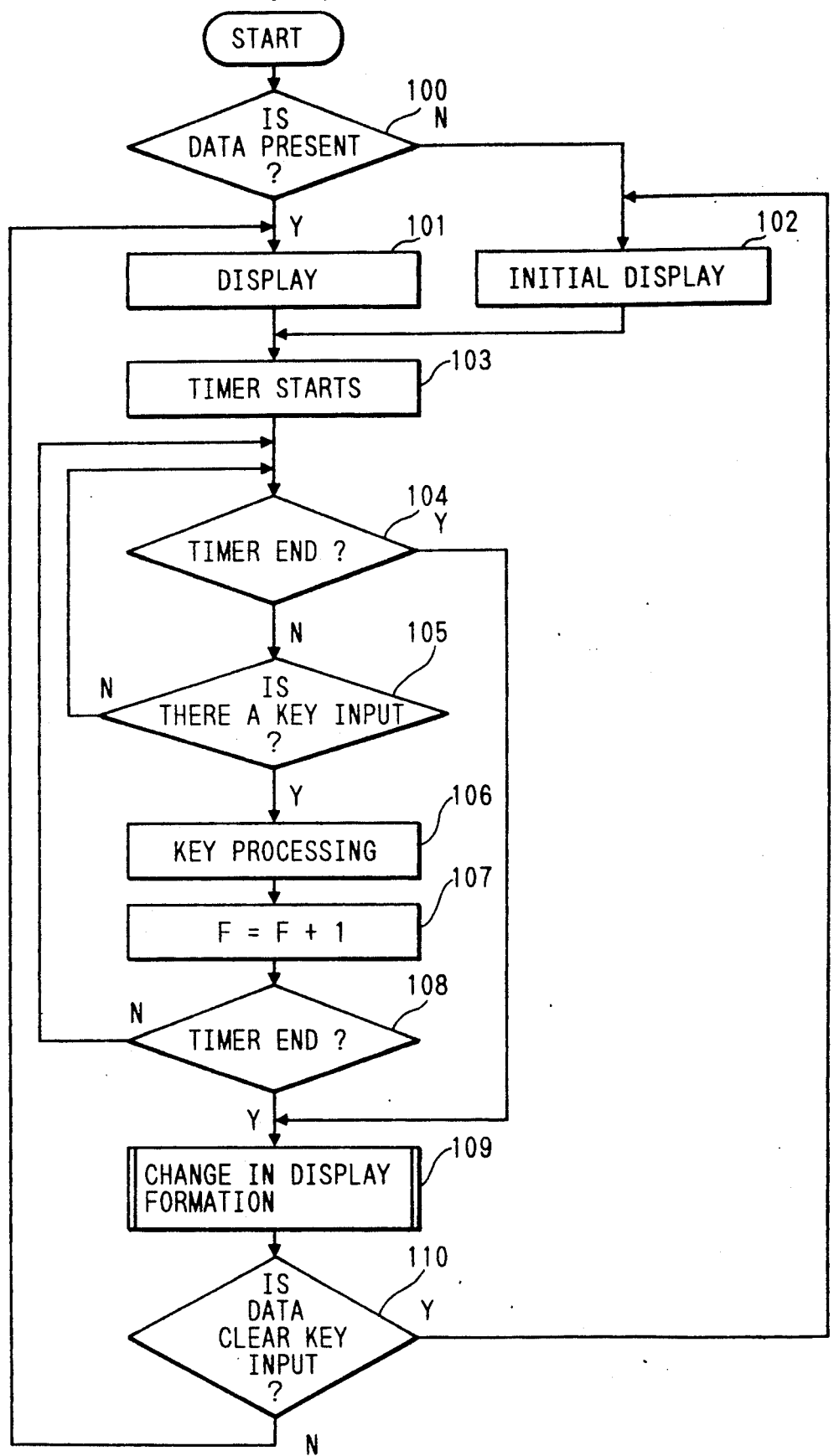

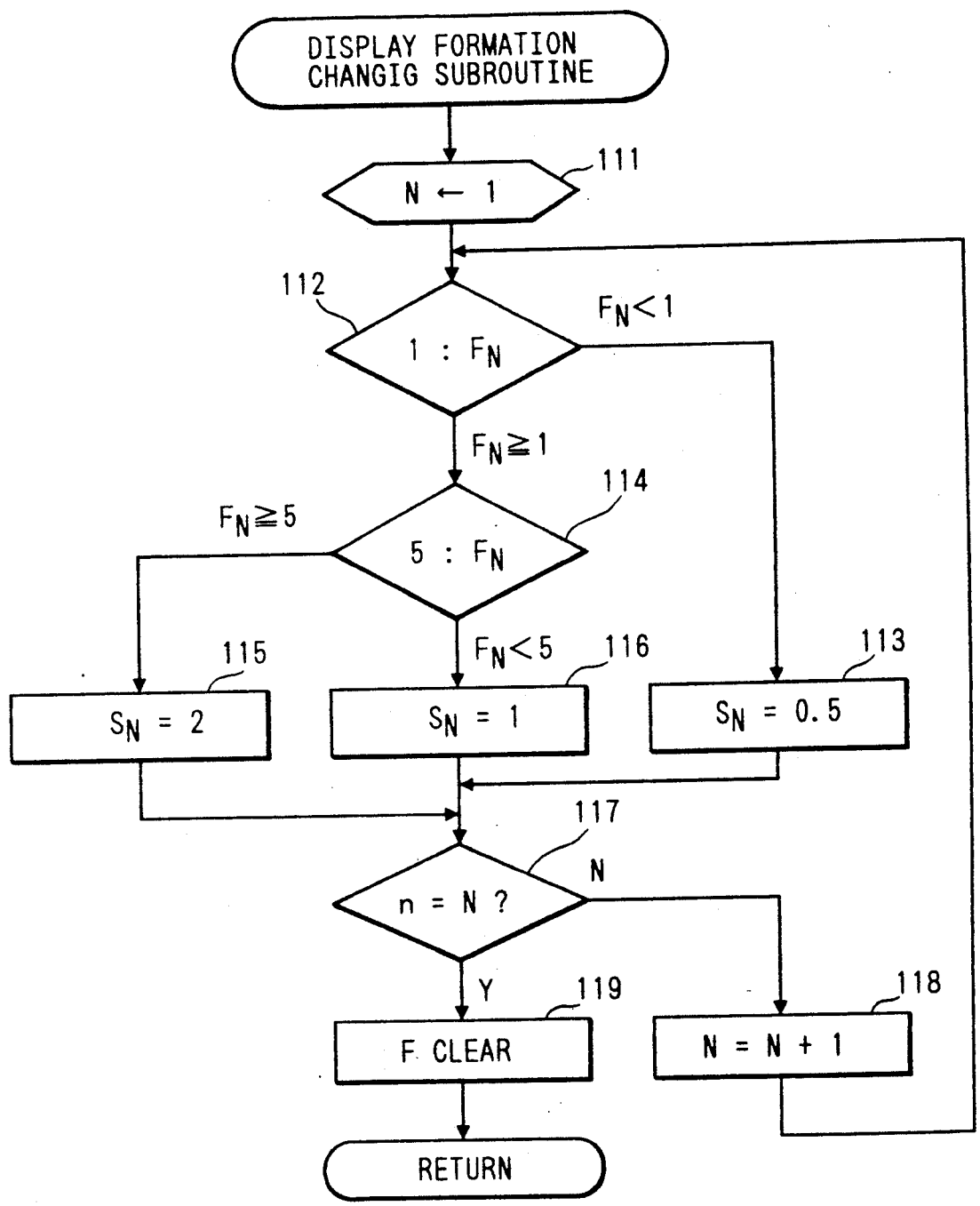

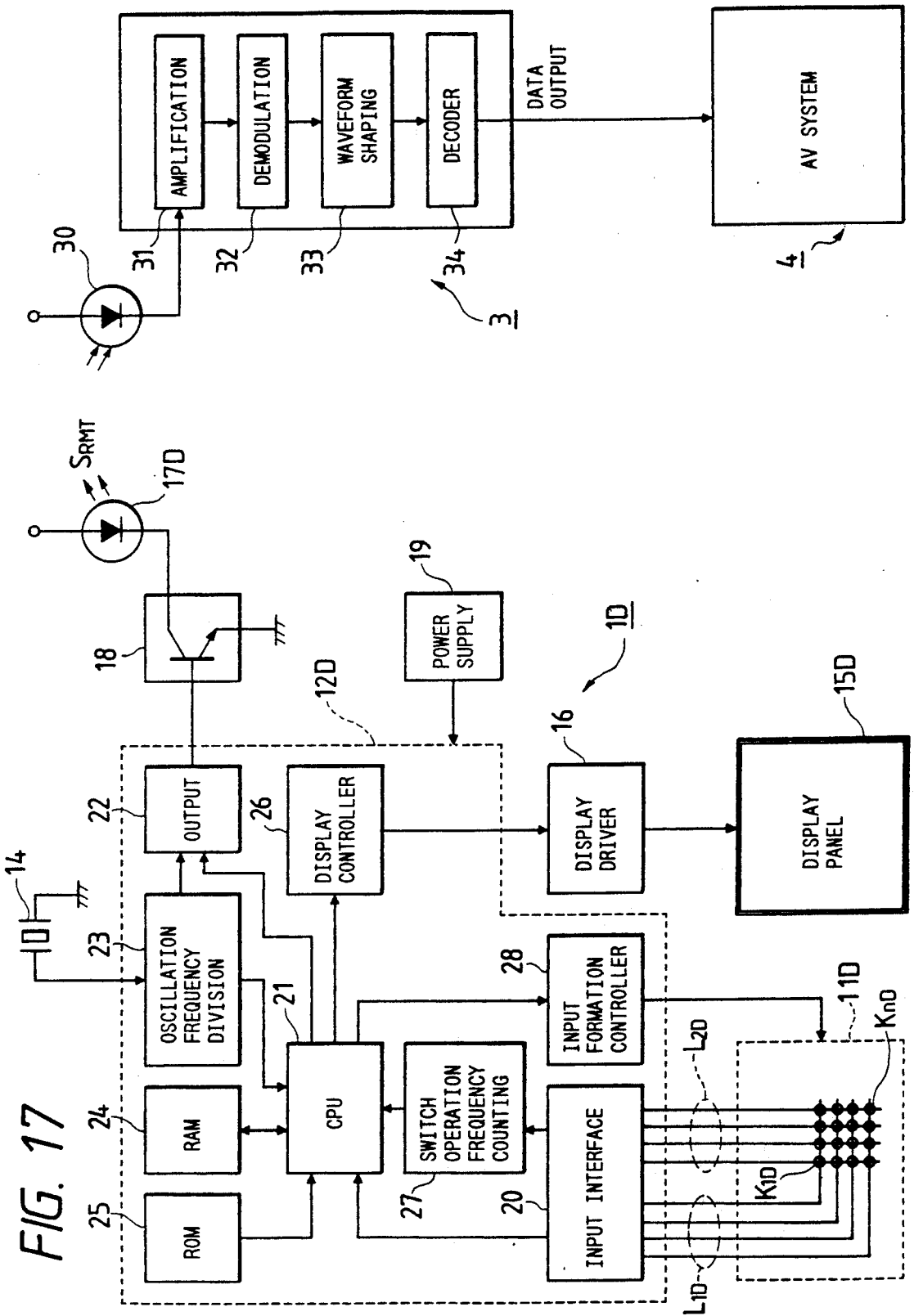

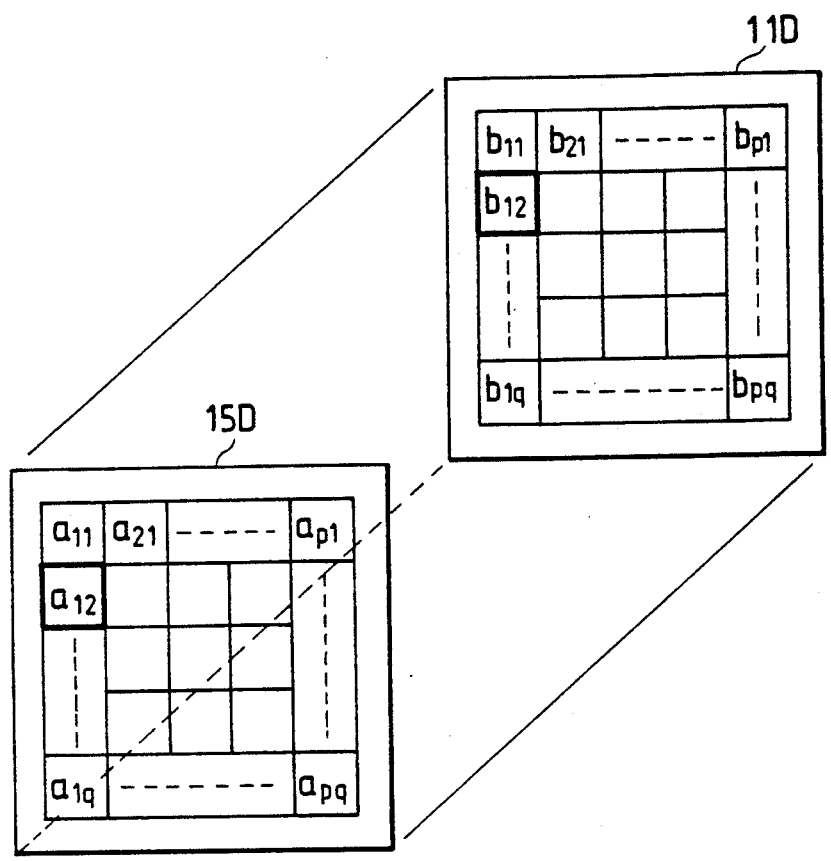

TRANSMITTER FOR REMOTE CONTROL WITH OPERATION SWITCHES HAVING CHANGEABLY DISPLAYED FORMS

BACKGROUND OF THE INVENTION

The present invention relates to a remote control device for various types of electronic apparatuses, and more particularly, to a transmitter for transmitting a remote control signal to an audio-visual system.

An audio-visual system (hereinafter referred to as "A.V. system"), such as a stereo reproduction apparatus, a cassette tape deck, a compact disk player, a television receiver, a video tape deck, and a laser vision disk player, is equipped with a remote control device. The remote control device is a combination of a transmitter and a receiver. The transmitter transmits a remote control signal from a position remote from the A.V. system being controlled. The remote control signal is normally conveyed by infrared rays. The receiver receives the remote control signal transmitted from the transmitter, decodes the control contents and outputs them to the A.V. system.

The transmitter is generally housed in a box-shaped case. On one surface of the case are provided a plurality of key switches from which various operation instructions are input to the transmitter. A display panel such as a liquid crystal panel may also be provided on the same surface of the case. On a surface of the case is provided an infrared radiation emitting element for emitting the remote control signal.

The display panel normally displays images which express functions that a user can control at a certain time, i.e., a menu of key operations, for users' convenience. The display panel may also have the function of confirming that a certain key operation is performed or of displaying the operation being performed at that time.

A display panel of a type which employs a transparent touch panel is also known. Such a display panel has both a display function and a key operation function. This type of display panel has transparent electrodes on the display panel, and allows a user to perform key operations by touching with his or her fingers a predetermined area of the transparent touch panel where a character or symbol representing the contents of the key operation is displayed.

The recent A.V. system trends toward a multi-function A.V. system. There is also a trend toward controlling the entirety of the A.V. system with a single remote control transmitter. In that case, a plurality of functions are allocated to a single key, and the user selects a desired function from these functions. In this way, a large number of functions can be handled without increasing the number of keys to be operated.

However, since a size of the display panel is practically limited, if a large number of operations are simultaneously displayed by the display panel, a display portion for displaying, individual contents becomes small, making a display of menu very difficult to see for the user. In the case of a display panel of the transparent touch panel type, the user has to touch very small areas with his or her fingers. This makes key operation very inconvenient, causing an erroneous touch of adjacent areas.

SUMMARY OF THE INVENTION

An object of the present invention is to provide a transmitter for remote control which is capable of transmitting a variety of operation instructions, has a display easy to see, and a switch easy to operate. In a preferred form of the present invention, there is provided a transmitter for remote control comprising: a switching means for inputting an operation instruction, including a plurality of operation switches; control means electrically connected to said switching means, said control means controlling generation of a remote control signal corresponding to an operation instruction which is input by said switching means; remote control signal generation means electrically connected to said control means, said remote control signal generation means being controlled by said control means such that it generates the remote control signal corresponding to said operation instruction which is input by said switching means and externally outputs the generated signal: and display means electrically connected to said control means, said display means displaying operation instruction images expressing the operation instructions in a form corresponding to the arrangement form of said switching means, said control means counting an input frequency of an individual operation instruction into said switching means and changing a display formation of said operation instruction images displayed on said display means and/or an arrangement formation of said plurality of operation switches in said switching means in accordance with said input frequency.

BRIEF DESCRIPTION OF THE DRAWINGS

FIG. 3 illustrates an example of a concept of a RAM data table employed in the first embodiment;

FIG. 4 is a flowchart of an example of an operation of the first embodiment;

FIG. 5 is a flowchart of an example of a formation changing processing which is carried out in the first embodiment;

FIGS. 6 and 7 show examples of the displays conducted in the first embodiment;

FIGS. 9 and 10 show other examples of the RAM data table employed in the first embodiment;

FIG. 17 is a circuit diagram of the fourth embodiment;

FIG. 18 shows a positional relation between a display panel and a transparent touch panel in the fourth embodiment; and FIGS. 19, 20 and 21 show concepts of the operation of the fourth embodiment.

DETAILED DESCRIPTION OF THE PREFERRED EMBODIMENTS

First Embodiment

Figure 1:
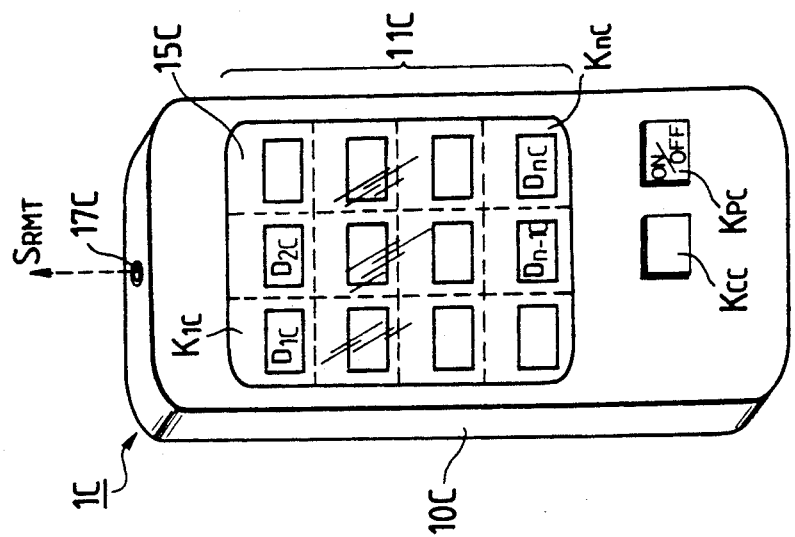
FIG. 1 is an external view of a first embodiment of a transmitter for a remote control device according to the present invention.

FIG. 1 shows an external view of a transmitter 1A as a first embodiment of the present invention.

The transmitter 1A is housed in a case 10A. On a surface of the case 10A is provided a keyboard 11A including a plurality of key switches which are remote control operation switches. The keyboard 11A serves as switching means. In the vicinity of the keyboard 11A is a display panel 15a which serves as display means. An emitting element 17A for emitting a remote control signal $S_{RMT}$ is provided on the longitudinal end surface of the case 10A. A photodiode may be employed as the light emitting element.

Generally, the transmitter 1A is driven by a battery as a power supply, so the case 10A incorporates a battery case that can exchangeably load a battery in, for example, the rear surface thereof, although the battery case is not shown in FIG. 1. Generally, the case 10A has a thin box-like shape which allows the user to hold with a hand. The case 10A is made of a plastic material or the like which is light in weight so as to easily handle and carry it.

On the keyboard 11A, a plurality of key switches $K_{1A}$ to $K_{nA}$ and a power switch $K_{PA}$ are disposed at appropriate intervals. Push-button type key switches whose key top protrudes from the surface of the case or flat keyboard type key switches whose surface is flat and which have a sheet-like form may be employed as the key switches.

A liquid crystal panel may be used as the display panel 15A. This liquid crystal panel basically consists of a pair of glass substrates, a pair of transparent electrodes which are inserted between the glass substrates, and a liquid crystal which is hermetically sealed between the transparent electrodes. In the liquid crystal panel, the orientation of the liquid crystal modecules changes by the application of a voltage between the electrodes, and the liquid crystal panel performs image display operation utilizing resulting changes in an optical characteristic thereof.

On a screen of the display panel 15A, operation menus $D_{1A}$ to $D_{nA}$ which express operation instruction items are displayed at positions corresponding to those of the key switches $K_{1A}$ to $K_{nA}$.

More specifically, in the transmitter 1A, contents of individual operation instructions are indicated on key tops of the key switches $K_{1A}$ to $K_{nA}$ in an adequate form. An operator confirms an operation content by the operation menu displayed on the display panel at a position corresponding to the key switch that the operator is going to push, and pushes the key switch which indicates a desired operation and thereby performs remote control. The contents of the operations include playback, stop, fast forward, rewinding, recording, picture recording, high-speed search and so on.

Next, an operation of the transmitter 1A will be described.

First, the operator presses a power switch $K_{PA}$ to set the transmitter in an operation mode. This causes an operation menu to be displayed on the display panel 15A.

The operator searches the display panel for an operation menu which expresses an operation content that he or she desires, and then presses the key switch on the keyboard which corresponds to a position on the display panel 15A where operation menu is displayed. This activates a signal processing circuit, which will be described later, incorporated in the transmitter 1A, and the signal processing circuit generates a remote control signal $S_{RMT}$ corresponding to the contents of the operation. The remote control signal $S_{RMT}$ is emitted from the emitting element 17A in a form of infrared radiation.

Generally, pulse position modulation (PPM) is employed as modulation method for the remote control signal $S_{RMT}$. The remote control signal $S_{RMT}$ generally contains "leader code" and its head, and "custom code", "inverted custom code", "data code", "inverted data code", which follow the "leader code".

Next, a circuit configuration of the transmitter 1A will be described with reference to FIG. 2.

The transmitter 1A for remote control device includes a signal processing circuit 12A for generating a remote control signal, an oscillator 14, a light-emitting driver 18 for driving the light-emitting element 17A, a display driver 16 for driving the display panel 15A, and a power supply 19.

The individual key switches $K_{1A}$ to $K_{nA}$ are disposed on intersections formed by signal line groups $L_{1A}$ and $L_{2A}$ which are arranged in a form of matrix. So, pressing of a key switch makes two signal lines connect with each other.

The signal processing circuit 12A includes an input interface 20, a remote control signal output system, and a control system.

The remote control signal output system includes an oscillation/frequency division circuit 23.

The control system serves as control means which includes a central processing unit (CPU) 21, a random access memory (RAM) 24, a read only memory (ROM) 25, a display controller 26 and an switch operation frequency counting circuit 27. The switch frequency counting circuit 27 serves as switch frequency counting means.

The signal line groups $L_{1A}$ and $L_{2A}$ are connected to the input interface 20. The input interface 20 outputs an address signal corresponding to a combination of the signal lines which are connected with each other when a certain key switch is pressed.

The input interface 20 is connected to the CPU 21.

The oscillator 14 is connected to the oscillation/frequency division circuit 23. The oscillator 14 generates a pulse signal as a carrier of the remote control signal $S_{RMT}$ and outputs it to the oscillation/frequency division circuit 23. The pulse signal is then divided and supplied from the oscillation/frequency division circuit 23 to an output circuit 22. The oscillation/frequency division circuit 23 is connected to the CPU 21 to supply a clock signal thereto.

When the CPU 21 receives the address signal which is output from the input interface 20, it sends out a command signal to the output circuit 22. Upon receipt of this command signal, the output circuit 22 outputs a pulse signal. The output circuit 22 is connected to the light-emitting driver 18, so the pulse signal is sent from the output circuit 22 to the light-emitting driver 18. The light-emitting driver 18 is connected to the light-emitting element 17A to drive the light-emitting element 17A. The light-emitting element 17A receives the pulse signal, and thereby emits infrared radiation corresponding to the pulse signal as the remote control signal $S_{RMT}$. The oscillator 14, the oscillation/frequency division circuit 23, the output circuit 22, the light-emitting driver 18 and the light-emitting element 17A form remote control signal generating means in combination.

The RAM 24 and the ROM 25 are connected to the CPU 21. The RAM or the ROM 25 stores programs required for a control the CPU or various types of data.

The display form control system includes a display controller 26 and a switch operation frequency counting circuit 27 which is a means for determining a number of times when the individual operations are operated.

The display controller 26 is connected to the CPU 21. The display controller 26 is also connected to the display driver panel 15A which is connected to the display driver 16.

The switch operation frequency counting circuit 27 is connected to the input interface 20 and the CPU 21. The power supply 19 supplies electric power to the transmitter.

Once the power switch $K_{PA}$ shown in FIG. 1 is pressed, the CPU 21 reads out image data corresponding to the operation menu displayed on the screen from the RAM 24 or the ROM 25.

The image data is transmitted from the CPU 21 to the display controller 26. The display controller 26 converts the received image data into an image control signal which controls an individual picture element on the display panel, and supplies the image control signal to the display driver 16. The display driver 16 amplifies the image control signal, and drives the display panel 15A by that image control signal. The operation menu is thus displayed on the display panel 15A.

The number of times when the individual operation is performed is counted by the switch operation frequency counting circuit 27 and is stored in a memory field in the RAM 24. The individual operations are divided into groups by the number of times when they are performed, and the resulting data is stored in another memory field in the RAM 24 as display formation data. The CPU 21 reads out the display formation data from the RAM 24 and transmits it to the display controller 26. The display controller 26 processes for changing a display formation of the individual operation menu items in accordance with the display formation data. For example, the display controller 26 changes a form or sequence of the operation menu. The CPU 21, the RAM 24, the display controller 26, and the display driver 16 in combination form the display formation control means.

In this way, since the operation menu which is operated frequently is made conspicuous on the display panel, it can be easily found by the operator.

An operation of a receiver which makes a pair with this transmitter for remote control will be described.

Figure 2:
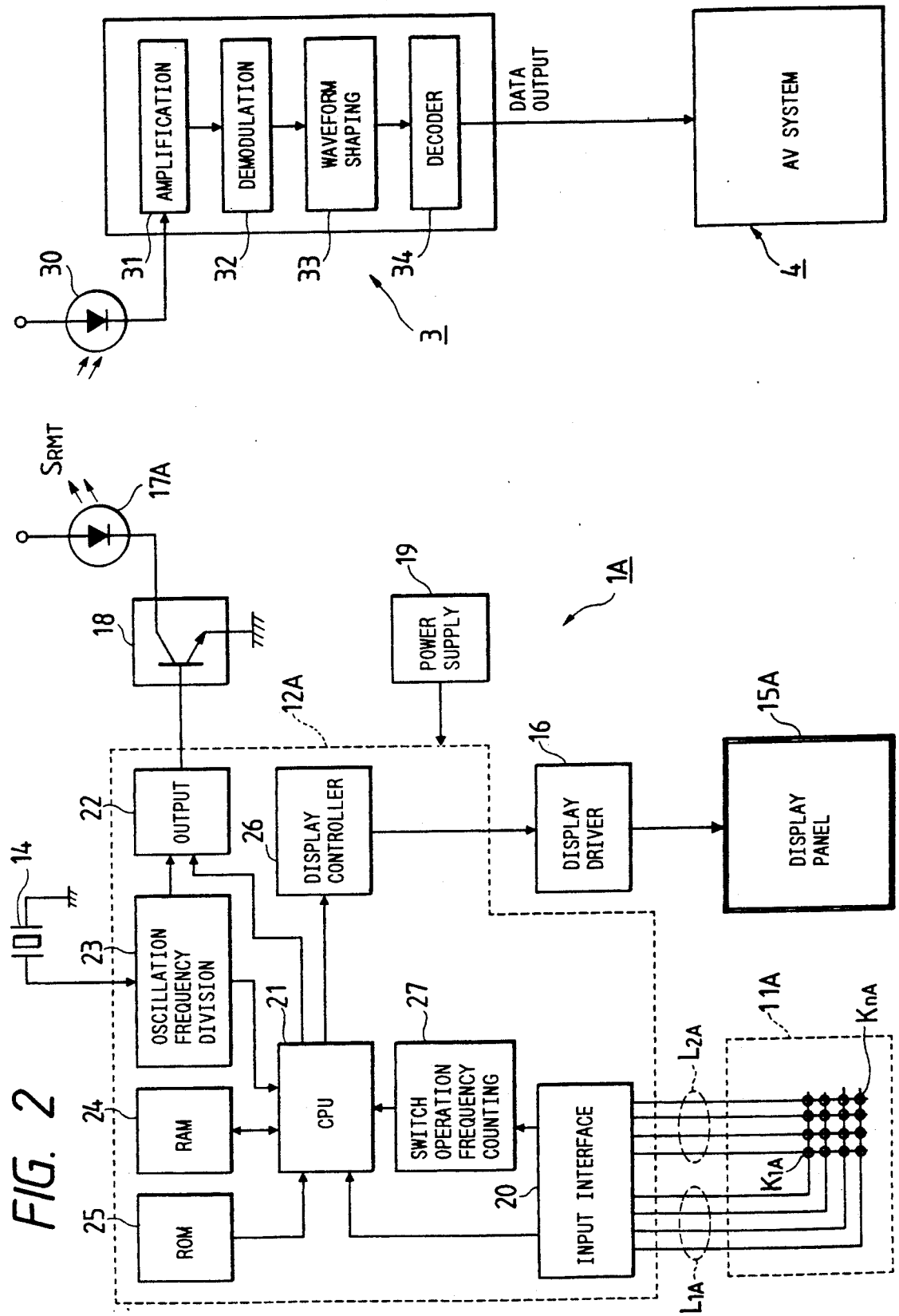
FIG. 2 is a block diagram of the first embodiment.

As shown in FIG. 2, the receiver 3 includes a light-receiving element 30, an amplifier circuit 31, a demodulation circuit 32, a waveform-shaping circuit 33, and a decoder 34. A photodiode may be employed as the light-receiving element 30. The light-receiving element 30 converts the received remote control signal $S_{RMT}$ into an electric signal so as to output it.

The amplifier circuit 31 is connected to the light-receiving element 30. The amplifier circuit 31 amplifies the electric signal output from the light-receiving element 30 to an adequate level and outputs the amplified signal.

The demodulation circuit 32 is connected to the amplifier circuit 31, and demodulates an output signal of the amplifier circuit 31.

The waveform-shaping circuit 33 is connected to the demodulation circuit 32, and shapes a waveform of the output signal of the demodulation circuit 32.

The decoder 34, which is a microcomputer, is connected to the waveform-shaping circuit 33. The decoder 34 decodes an output of the waveform-shaping circuit 33. A content of a decoded signal corresponds to a content which is input by the key switch. An output signal of the decoder 34 is transmitted to an A.V. system 4, and the A.V. system 4 performs an operation corresponding to a content of the remote control signal.

Procedure of Changing Display Formation

Next, a procedure of changing the display formation on the display panel in accordance with the frequency with which the operation keys are used will be described.

First, the switch operation frequency counting circuit 27 will be described.

Once a certain key switch is operated, the switch operation frequency counting circuit 27 receives an address signal corresponding to an operated key switch from the input interface 20, and counts the number of times when the key switch is operated.

An accumulated total of the number of times when the individual key switches among $K_{1A}$ to $K_{nA}$ are used is stored in a key frequency data table in the RAM 24 by the CPU 21. The number of times when the key switches are used may be obtained by providing a timer (not shown in illustration) and counters (not shown) in the same number as that of the overall key switches $K_{1A}$ to $K_{nA}$ and by counting the number of times when the individual key switches are used in a predetermined period of time. Once the time set in the timer is reached, the CPU 21 updates the key frequency data in the RAM 24. That is, the CPU 21 inputs new data representing the number of times when the operation keys are used into addresses in the key frequency data table in the RAM 24 corresponding to the values counted by the individual counters in the switch operation frequency counting circuit 27. The RAM 24 serves as memory means.

FIG. 3 shows an example of a key frequency data table which stores key frequency data in the RAM 24. The RAM 24 contains an operation content data table which stores operation content data $O_1$ to $O_n$ allocated to the individual key switches $K_{1A}$ to $K_{nA}$, the key frequency data table which stores key frequency data $F_1$ to $F_n$ which represent the number of times when the individual keys are used, and a display formation data table which stores display formation data $S_1$ to $S_n$. The display formation data $S_1$ to $S_1$ n are determined by magnitude of the corresponding key frequency data $F_1$ to $F_n$.

FIGS. 4 and 5 are flowcharts of the storage procedure of the data above-mentioned.

First, the CPU 21 determines whether or not the display formation data $S_1$ to $S_n$ are already present (step 100). If $S_1$ to $S_n$ are already present, the CPU 21 sends to the display controller 26 image data representing the display information corresponding to the stored display formation data. Upon receipt of the image data, the display controller 26 outputs a display control signal to the display driver 16, which drives the display panel 15A on the basis of the received display control signal (step 101).

If the display formation data is not yet stored, the CPU 21 supplies to the display formation data table an initial value (for example, a value "one" is set to $F_1$ to $F_n$) so that the display panel 15A performs initial display (step 102).

Next, the CPU 21 starts the timer (step 103). While monitoring the end of the operation of the timer (step 104), the CPU 21 determines whether or not there is an input of a key switch (step 105). In a case where the time set in the timer is reached without no input from the key switches, the processing goes to a display formation changing subroutine, which will be described later, (in step 109). If there is an input from a key switch, the corresponding key operation is performed (in step 106), and 1 is added to the key frequency data F corresponding to an operated key switch (step 107).

The processings from step 104 to step 107 are repeated until the time set in the timer is reached (step 108). Thus, the number of times when the key switches are operated is counted and stored in the key frequency data table by the aforementioned procedure. After the time set in the time is reached (step 108), the processing goes to the display formation changing subroutine (step 109).

FIG. 5 is a flowchart of the display formation changing subroutine.

First, 1 is set in a value N of a loop counter (step 111).

Next, the key frequency data $F_1$ corresponding to the key switch $K_1$ is compared with 1 (step 112). If $F_1$ is less than 1, a value 0.5 is set to the display formation data $S_1$ corresponding to the key switch $K_1$ (step 113). If $F_1$ is equal to or greater than 1, it is determined (in step 114) whether or not $F_1$ is greater than 5. If $F_1$ is equal to or greater than 5, a value 2 is set to the display formation data $S_1$ (step 115). If $F_1$ is less than 5, a value 1 is set to the display formation data $S_1$ (step 116).

Next, it is determined (in step 117) whether or not the value N in the loop counter reaches n (step 117). If the value N in the loop counter is less than n, a value 1 is added to N (step 118), and the processings from step 112 to step 116 are repeated until the value N in the loop counter reaches n.

If the value N in the loop counter has reached n, the key frequency data $F_1$ to $F_n$ are all cleared (0 is set to $F_1$ to $F_n$) (step 119), and the processing returns to a main routine.

In the main routine, it is determined (step 110) whether or not a data clear key which initializes the data is input. If the data clear key is input, an initial display is performed (step 102), and the processings from step 103 to step 109 are then repeated. If the data clear key is not input, the processing of step 101 and those from step 103 to step 109 are performed.

FIG. 6 shows an example of display employed in the first embodiment. FIG. 6 comprises FIG. 6A which shows an example of the initial display screen on the display panel 15A, and FIG. 6B which shows an example of the display of the display panel 15A which is obtained after the key switches are operated. In the case shown in FIG. 6, n=9.

In the initial display screen shown in FIG. 6A the images $D_{1A}$ to $D_{9A}$ which display the operation menu of the key switches $K_{1A}$ to $K_{nA}$ having the same size each other. However, the size of the image is changed in the manner shown in FIG. 6B after the key switches are operated. In the example shown in FIG. 6B, $D_{1A}$, $D_{5A}$ and $D_{6A}$ indicate that corresponding key switches $K_{1A}$, $K_{5A}$ and $K_{6A}$ having been operated, for example, 5 times or more (in other words, the corresponding key switches have a display formation data S of 2), and have a size twice that of the initial display screen. $D_{3A}$, $D_{4A}$ and $D_{9A}$ indicate that corresponding key switches $K_{3A}$, $K_{4A}$ and $K_{9A}$ have not been operated at all (in other words, the corresponding key switches have display formation data S of 0.5), and have a size 0.5 times that of the initial display screen. $D_{2A}$, $D_{7A}$ and $D_{8A}$ indicate that corresponding key switches $K_{2A}$, $K_{7A}$ and $K_{8A}$ have been operated 1 to 4 times (in other words, the corresponding key switches have display formation data S of 1), and have the same size as that of the initial display screen.

In the above-described embodiment, the display formation on the display panel is changed in accordance with the number of times when the key switches are used by changing the size of the display image on the display panel. However, the display formation may also be changed in other ways. For example, a shape of the display image may be changed.

Also, a density of the display areas may be changed without changing the size thereof, as shown in FIG. 7A. More specifically, the key operations which are conducted frequently (whose display formation data S is 2) may be displayed at the highest density, like $D_{1A}$, $D_{5A}$ and $D_{6A}$. The key operations whose display formation data S is 1 may be displayed at the second highest density, like $D_{2A}$, $D_{7A}$ and $D_{8A}$. The key operations whose display formation data S is 0.5 may be displayed at the lowest density, like $D_{3A}$, $D_{4A}$ and $D_{9A}$. This display is performed by changing the voltage applied to the individual areas on the liquid crystal display panel in accordance with the magnitude of the display formation data S.

In the above description, a monochrome liquid crystal is employed. However, a color liquid crystal panel may also be employed. In that case, the individual areas on the display panel may be displayed in different colors in place of the different densities shown in FIG. 7A. For example, the key operations which are performed frequently whose display formation data S is 2 may be displayed in red, the key operations whose display formation data S is 1 may be displayed in green, and the key operations whose display formation data S is 0.5 may be displayed in black.

Change in the display formation which is performed in other manner than the above-described one may also be possible.

That is, any type of display by which frequently operated key switches may be made more conspicuous than that of the other less frequently operated key switches.

In an example shown in FIG. 7B, the key operations whose display formation data S is 2 may be displayed in a reversed picture, the key operations whose display formation data S is 1 may be framed, and the key operations whose display formation data S is 0.5 may be displayed without any special form or sign supplied thereto.

In an example shown in FIG. 7C, three star marks may be added to the key operations whose display formation data S is 2, a star mark may be added to the key operations whose display formation data S is 1, and no star mark is added to the key operations whose display formation data is 0.5.

In the above-described examples, the display formation data S has three steps including 2, 1 and 0.5. However, they may have two steps. Alternatively, they may have four or more steps.

Figure 8:
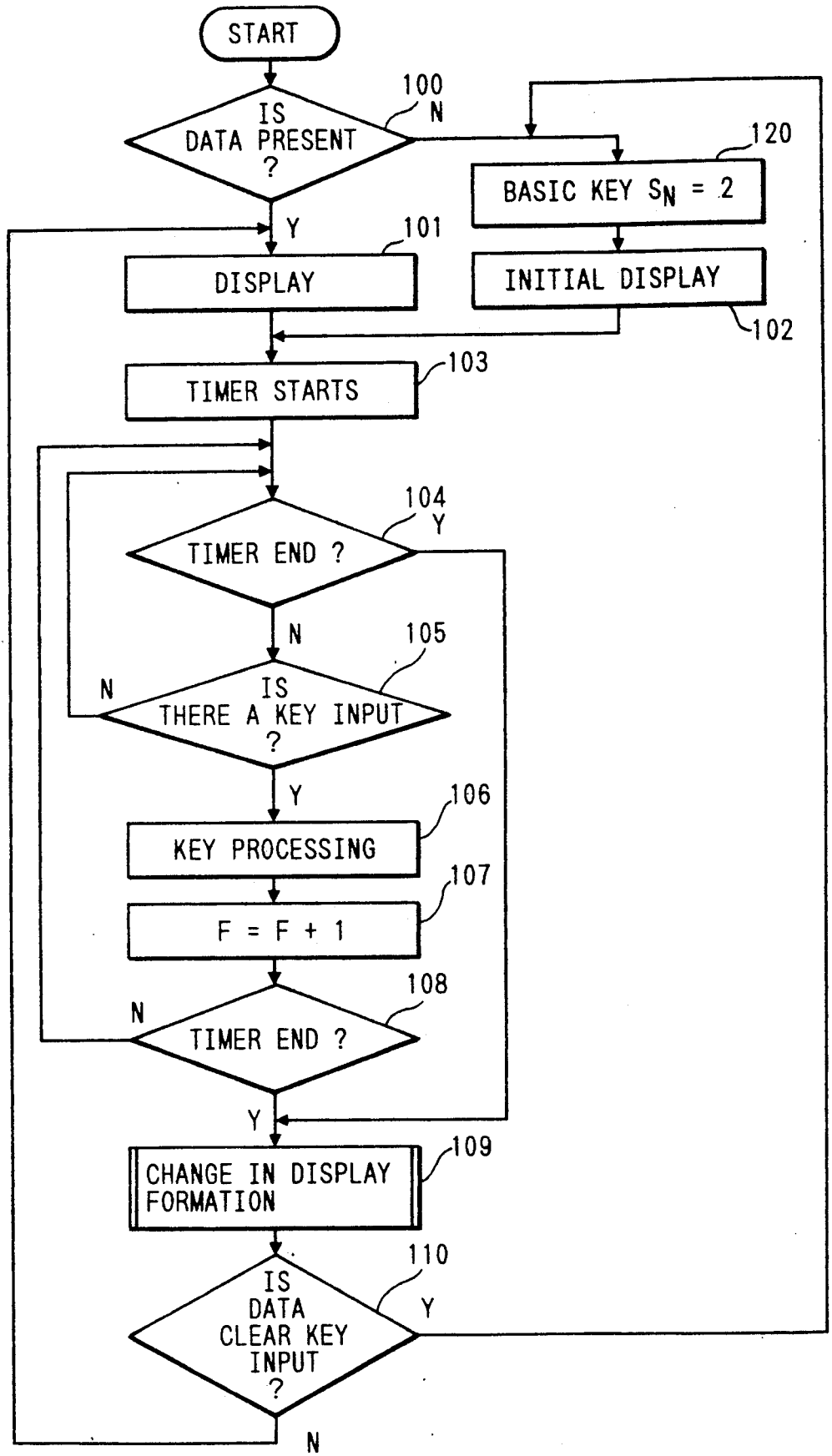
FIG. 8 is a flowchart of another example of the formation changing processing which is carried out in the first embodiment.

In the example shown in FIG. 6A, the individual display images on the initial display screen have the same size. However, an operation which is expected to be frequently operated may be displayed in a different manner (in a different display size, density or color) from other operations on the initial display screen. More specifically, regarding such particular basic operation keys, 2 may be set to S (step 120) before the initial display is performed, as shown in FIG. 8.

In the above-described example, the number of times when the individual keys are used within a predetermined period of time is counted by using the timer, and the display formation is changed in accordance with the counted number of times. However, another type of display may also be possible without employing a timer by providing a data table such as that shown in FIG. 9 in the RAM 24.

The RAM 24 shown in FIG. 9 contains a used key switch memory which serves as storage means and stores $P_1$ to $P_x$ in place of the key data table $F_1$ to $F_n$. The used key switch memory $P_1$ to $P_x$ stores key switch numbers $P_1$ to $P_x$ by sequentially updating the key switch numbers. The CPU 21 total the number of times when a certain key switch $K_i$ is operated with data stored in the used key switch memory $P_1$ to $P_x$, and inputs it in a memory address $F_1$. The display formation data S is obtained from the key frequency data F in the same manner as that shown in FIG. 5. In this way, the timer can be eliminated.

Figure 10:
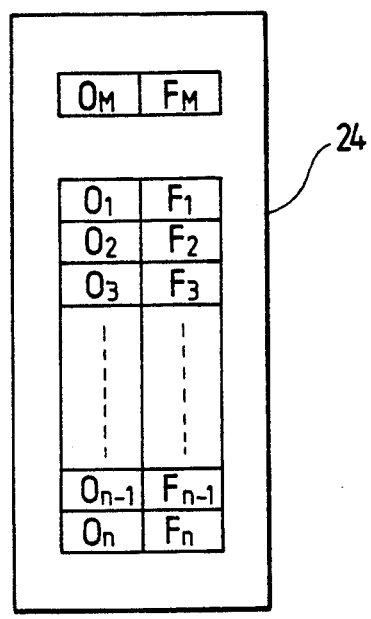

The display formation may also be changed by changing a display sequence in the order of operation frequency with which the keys are used. The example is realized by providing the RAM 24 which stores a data table such as that shown in FIG. 10.

Figure 11:
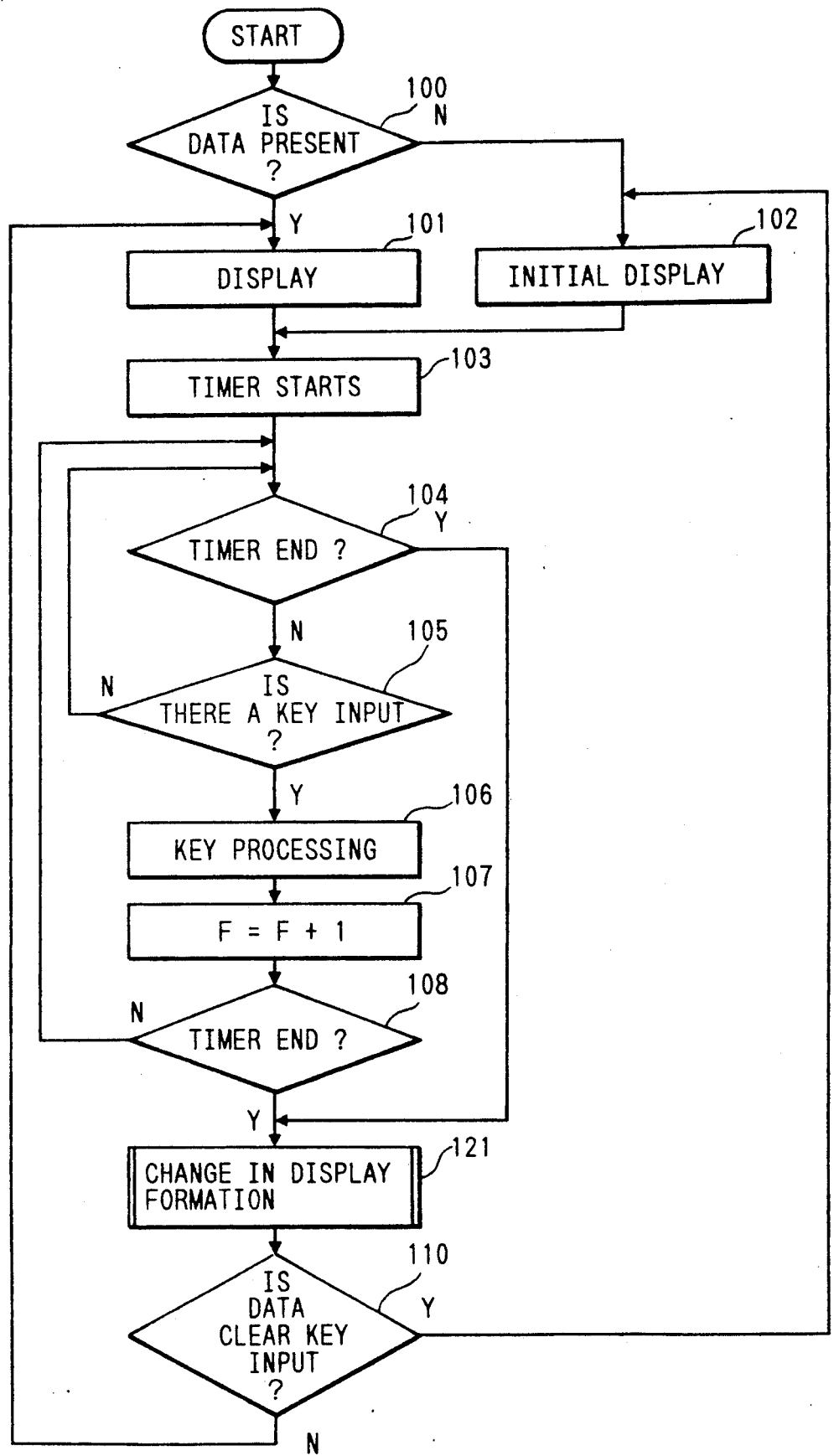
FIG. 11 is a flowchart of another example of the operation performed in the first embodiment.
Figure 12:
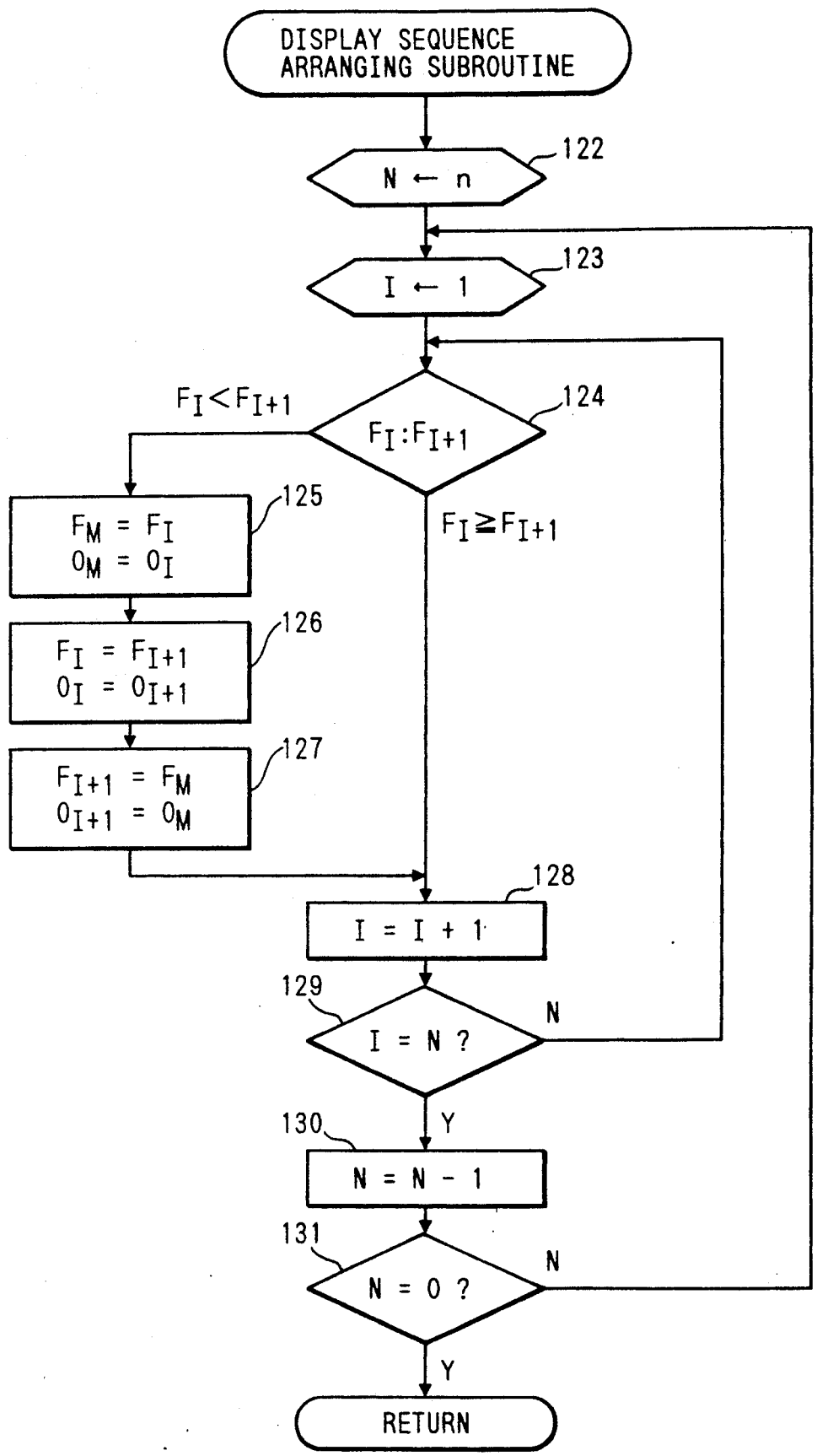
FIG. 12 is a flowchart of another example of the formation changing processing which is carried out in the first embodiment.

Also, a display sequence arranging subroutine is inserted in place of the display formation changing subroutine 109 shown in FIG. 4, as shown in FIG. 11. FIG. 12 is a flowchart of the display sequence arranging subroutine.

First, n is set in a value of a first loop counter N (step 122).

Next, 1 is set to a value of a second loop counter I (step 123).

Thereafter, the key frequency data $F_1$ corresponding to the key switch $K_1$ is compared with the data $F_2$ corresponding to the key switch $K_2$ (step 124). If $F_1 \geq F_2$, the processing goes to step 128 where 1 is added to I and the data $F_2$ is then compared with the data $F_3$.

If $F_1 < F_2$, the key frequency data $F_1$ is temporarily stored in a memory $F_M$, and the operation content data $O_1$ is also temporarily stored in a memory $O_M$ (step 125).

Thereafter, the data $F_2$ is placed at the key data position where the data $F_1$ has been present, and the data $O_2$ is inserted at the operation content data position where the data $O_1$ has been present (in step 126).

Next, the data $F_1$ stored in the memory $F_M$ is placed at the key data position where the data $F_2$ has been present, and the data $O_1$ stored in the memory $O_M$ is placed in the operation content data position where the data $O_2$ has been present (in step 127).

Figure 13A:
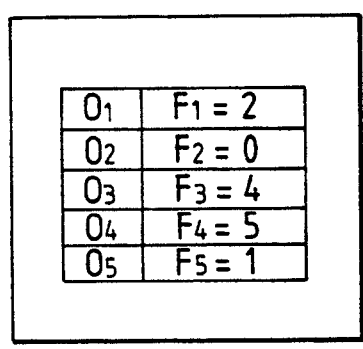
FIG. 13 shows the contents of the RAM data table employed in another example of the formation changing processing performed in the first embodiment.
Figure 13B:
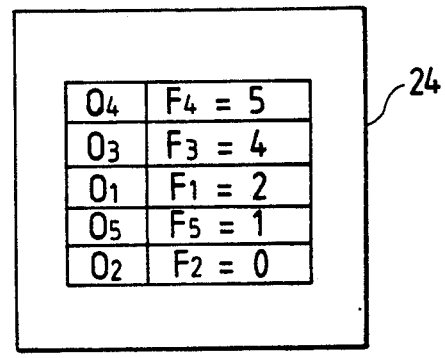

Thus, $F_1$ and $F_2$ are rearranged in the order of $F_2$ and $F_1$. Thereafter, the processing goes to step 128 where 1 is added to I, and $F_2$ and $F_3$ are then compared with each other. The above-described procedure is repeated until I equals N, i.e., until I equals n in this case (step 129). In this way, the minimum value (e.g., $F_P$) in $F_1$ to $F_n$ can be placed at the position where the key data $F_n$ has been present. Next, N−1, i.e., n−1 is set to N (step 130), and the processings from step 123 to step 130 are repeated so as to place the minimum value (e.g., $F_Q$) in (n−1) data items obtained by eliminating the $F_P$ from $F_1$ to $F_n$ at the position where $F_{n-1}$ has been present. In this way, the data $F_1$ to $F_n$ can be rearranged in the order of magnitude, and the corresponding key operation content data $O_1$ to $O_n$ can also be rearranged in the same order. FIG. 13 shows this example of rearrangement. In the case shown in FIG. 13, n equals 5. The key data $F_1$ to $F_5$, which are arranged in the order shown in FIG. 13A, are rearranged in the order of magnitude by the display sequence arranging subroutine, as shown in FIG. 13B. Concurrently with this, the corresponding key operation content data $O_1$ to $O_5$ are also rearranged.

After the rearrangement, a display is performed on the display panel 15A by using a new order of data F. Thus, the frequently operated key operations are displayed at the beginning of the display panel 15A, and this makes a search of such key operations easy for the operator. Furthermore, the operation content data O are moved together with the key frequency data F, and this allows the operator easily to perform the same operation as that displayed by pressing the key switch located at a position corresponding to an operation menu on the display panel. In this case, the CPU 21 serves as input formation control means.

Figure 14:
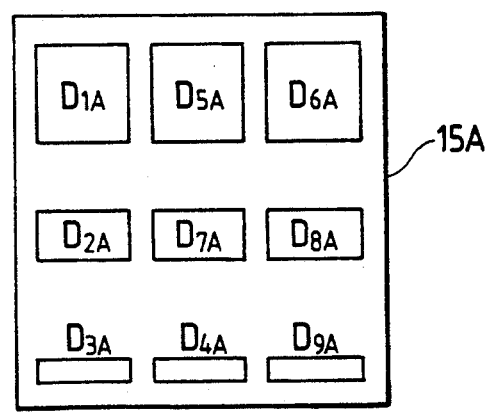
FIG 14 shows another display example in the first embodiment.

The display sequence arranging subroutine is inserted in place of the processing of step 109 shown in FIG. 4. However, it may be inserted between step 117 and step 119. Furthermore, the display formation changing subroutine shown in FIG. 5 may be inserted between step 131 shown in FIG. 12 and step shown in FIG. 11. In this way, both the sequence of the display of the key operations and the display size or the like of the key operations can be rearranged in accordance with the frequency which the individual keys are used. In other words, the display shown in FIG. 6B may be displayed in different order or in different display size, as shown in FIG. 14 in which it is assumed that $F_1 > F_5 > F_6 > F_2 > F_7 > F_8 > F_3 > F_4 > F_9$.

Second Embodiment

Figure 15:
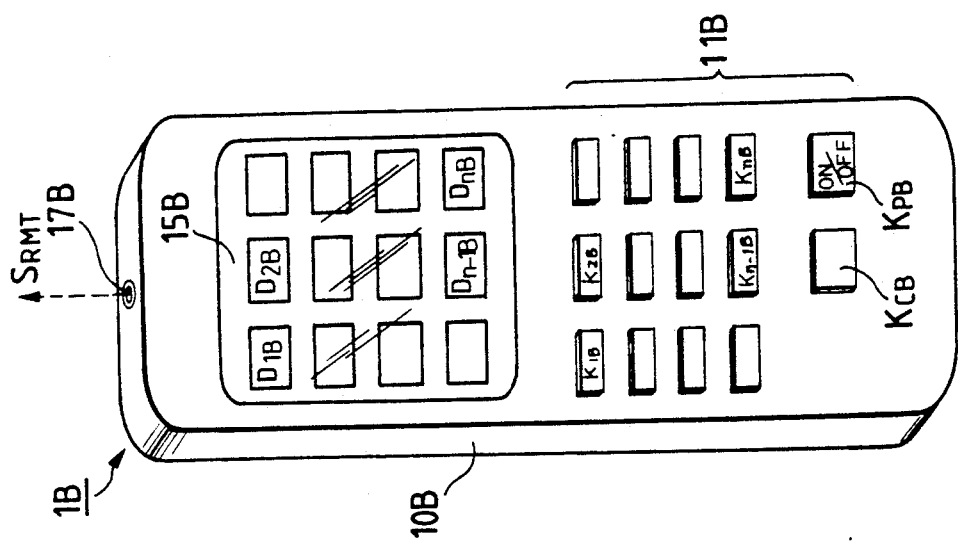
FIG. 15 is a perspective view of a second embodiment of the transmitter for a remote control device according to the present invention.

FIG. 15 shows an external view of a second embodiment of the transmitter for remote control according to the present invention.

This transmitter 1B differs from the transmitter 1A shown in FIG. 1 in the following points: a keyboard which serves as switching means includes m key switches $K_{1B}$ to $K_{mB}$ which are key operation switches, a screen change-over switch $K_{CB}$, and a power switch $K_{PB}$. In this transmitter the screen can be sequentially switched over from 1 to j by means of the screen change-over switch $K_{CB}$. After the screen j has been reached, the screen returns to 1. On one screen, m operation menu options $D_{1B}$ to $D_{mB}$ are displayed at positions corresponding to those of the key switches $K_{1B}$ to $K_{mB}$. Thus, the key operations total up to $n = m \times j$. In this transmitter 1B, contents of operation instruction are illustrated in an adequate form (for example, in different colors) on the key top of the individual key switches $K_{1B}$ to $K_{mB}$. An individual operation instruction corresponds to those in an individual screen. The transmitter 1B has the same circuit configuration as that of the transmitter 1A shown in FIG. 2 with the exception that the input interface 20 and the display controller 26 have structures different from those to the transmitter 1A and that the processing procedure which is carried out by the CPU 21 differs from that of the transmitter 1A.

In the thus-arranged transmitter 1B, the screens can be changed over in accordance with the A.V. systems being controlled. For example, screen 1 may be used to control an amplifier, screen 2 may be used for an TV receiver, and screen 3 may be for a video deck. Furthermore, an operation menu which is not used frequently may be moved from a screen 1 to a screen 2, and the operation menu which is used less frequently may be moved from a screen 2 to a screen 3. In the second embodiment, all the examples of the changes in the display formation and in the display sequence, which are carried out in the first embodiment, can be performed.

Third Embodiment

Figure 16:
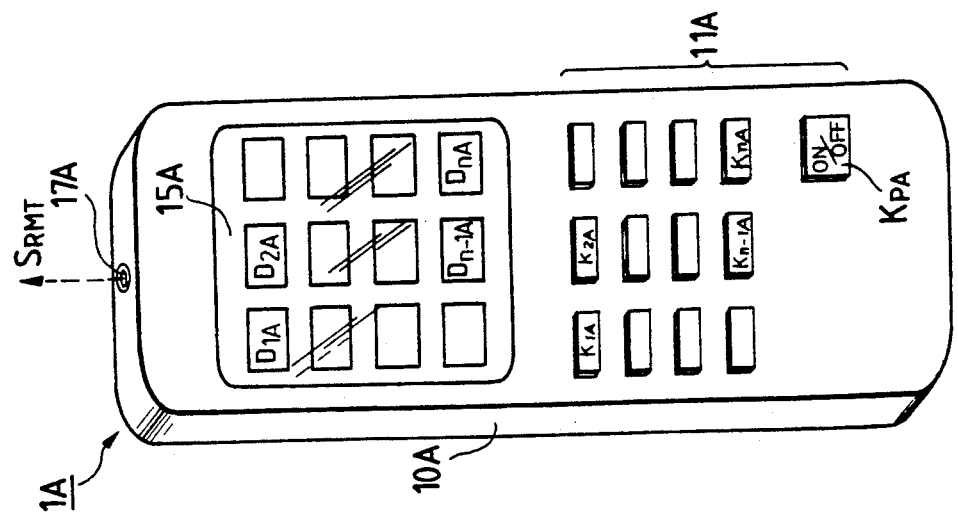
FIG. 16 is a perspective view of third and fourth embodiments of the transmitter according to the present invention.

FIG. 16 shows an external view of a transmitter 1C of a third embodiment.

The transmitter 1C differs from the transmitter 1A of the first embodiment in that a touch panel 11C with transparent electrodes is provided on a display panel 15C such as a liquid crystal panel, which serves as both the display means and switching means. In this way, the push-button type key switches which are employed in the first and second embodiments are eliminated, and the operator can perform a desired remote control operation by lightly touching with his or her fingers the touch panel area placed on the desired display area on the display panel 15C. The transparent touch panel 11C provides a plurality of transparent touch switches $K_{1C}$ to $K_{nC}$ which are operation switches.

The transmitter 1C has the same circuit configuration as that of the transmitter 1A shown in FIG. 2. All the examples of the display of the display panel, which are explained in the first and second embodiments, can be carried out in this embodiment. Consequently, the display formation (such as the display size, the density, the color, the sign and so on) for the display panel or the display sequence can be changed in accordance with the frequency with which the individual switches are operated. Furthermore, a change-over key $K_{cc}$ may be provided so as to perform change-over of the display screen.

Fourth Embodiment

A fourth embodiment of the remote control transmitter according to the present invention will be described in detail with reference to FIGS. 17 to 21.

A transmitter 1D has the same external view as that of the third embodiment shown in FIG. 16, and therefore allows the operator to perform a desired remote control operation by touching with his or her fingers the transparent touch panel area placed on the desired display area on the display panel.

However, the fourth embodiment differs from the third embodiment in that formation of both the transparent touch panel areas from which key input is performed and the display areas on the display panel which correspond to the transparent touch panel areas can be changed simultaneously in accordance with the frequency with which the individual keys are operated.

FIG. 17 is a block diagram of the transmitter 1D.

As shown in FIG. 17, the transmitter 1D incorporates a signal processing circuit 12D for generating a remote control signal. The transmitter 1D differs from the transmitter 1A in that the signal processing circuit 12D includes an input formation controller 28, which is connected to the CPU 21 and a switch unit 11D. The switch operation frequency counting circuit 27 counts the number of times when the switches are operated, and outputs a result as switch operation data to the CPU 21. The CPU 21 changes input formation data on the basis of the switch operation data, and outputs the changed input formation data to the input formation controller 28. The input formation controller 28 receives the input formation data and changes the form of a transparent touch panel 11D. Simultaneously with this, the CPU 21 changes display formation data on the basis of the switch operation data and outputs the changed display formation data to the display controller 26. The display controller 26 outputs to the display driver 16 a control signal which changes the display formation on a display panel 15D. The display driver 16 drives the display panel 15D which is display means on the basis of the control signal. The CPU 21, the RAM 24 and the input formation controller 28 in combination form input formation control means.

FIG. 18 shows a positional relation between the display panel 15D and the transparent touch panel 11D.

As shown in FIG. 18, the display panel 15D is divided into a plurality of areas $a_{11}$ to $a_{pq}$. The total number of the areas $a_{11}$ to $a_{pq}$ is $p \times q$. The transparent touch panel 11D is divided into areas $b_{11}$ to $b_{pq}$. The total number of the areas $b_{11}$ to $b_{pq}$ equals $p \times q$. The individual areas $b_{11}$ to $b_{pq}$ are placed on top of the individual areas $a_{11}$ to $a_{pq}$. As a result, a switch operation corresponding to, for example, an area $a_{12}$ on the display panel 15D can be performed by touching an area $b_{12}$ on the transparent touch panel.

Figure 19:
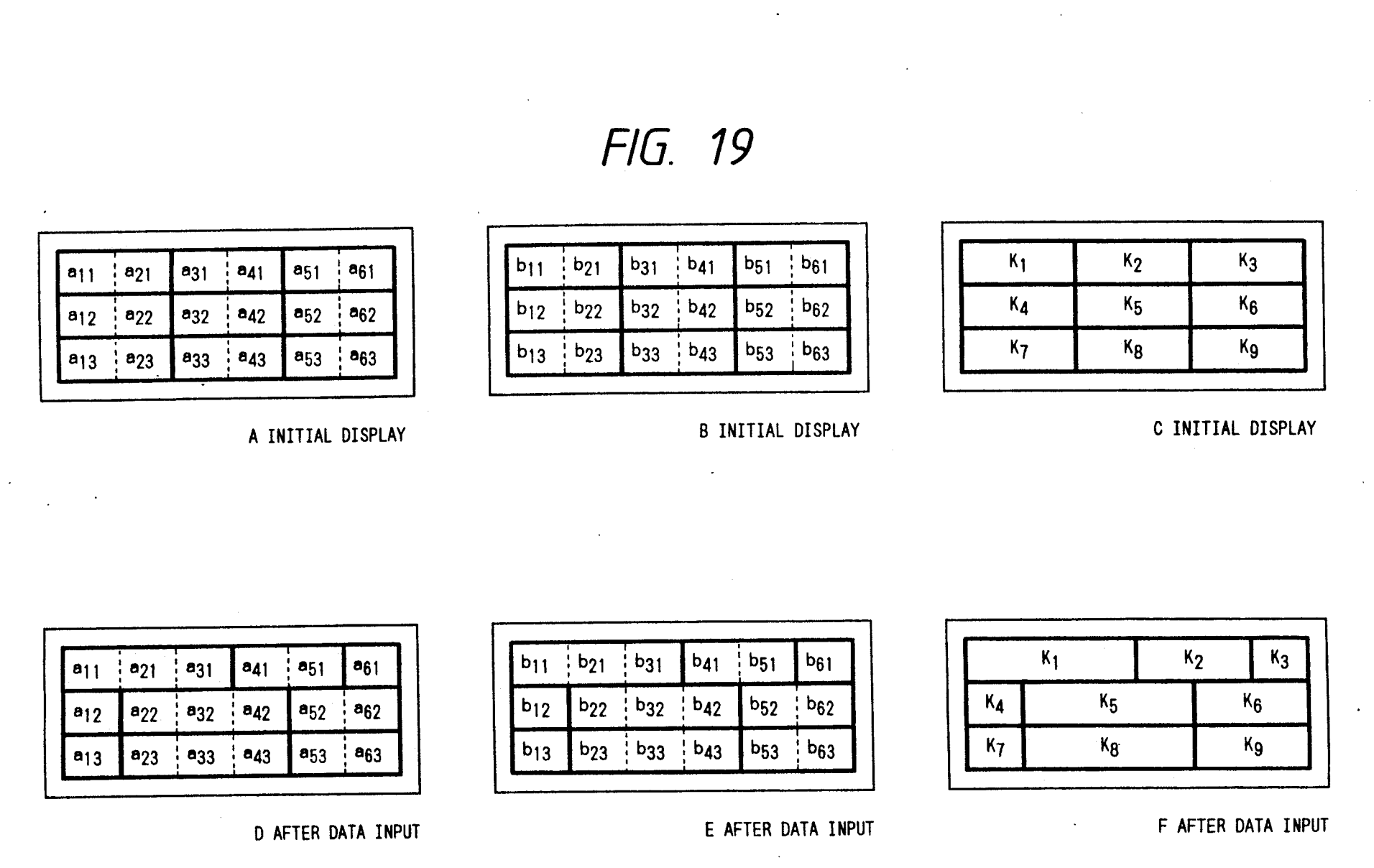

An operation of the fourth embodiment will be described below with reference to FIG. 19. FIG. 19A shows an initial state of the display panel 15D, FIG. 19B shows an initial state of the transparent touch panel 11D, and FIG. 19C shows the concept of switching means which consists of the display panel 15D and the transparent touch panel 11D. In this embodiment, the number of switches in switching means is 9.

The display panel 15D is divided into 18 areas ($a_{11}$ to $a_{63}$), and the display panel 11D is divided into 18 areas ($b_{11}$ to $b_{63}$).

In the initial state, an image corresponding to the switch $K_1$ is displayed on the display panel 15D by, for example, areas $a_{11}$ and $a_{21}$, and a corresponding transparent touch switch $K_1$ is formed by areas $b_{11}$ and $b_{21}$, and a corresponding transparent touch switch $K_1$ is formed by areas $b_{11}$ and $b_{21}$ on the transparent touch panel 11D, as shown in FIG. 19A, 19B and 19C. Hence, the operator can operate the switch $K_1$ by touching any portion of the area formed by the areas $b_{11}$ and $b_{21}$ transparent touch panel 11D.

FIG. 19D shows a state of the display panel 15D whose display formation has been changed as a consequence of switch operations in a predetermined period of time, FIG. 19E shows a state of the transparent touch panel 11D which is obtained after the switch operations have been conducted in a predetermined period of time, and FIG. 19F shows the concept of the switching means.

As shown in FIGS. 19D, 19E and 19F, if a switch $K_5$ has been used frequently, it is displayed by an area formed by, for example, three areas $a_{22}$, $a_{32}$ and $a_{42}$ on the display panel 15D (i.e., it is displayed by a size 1.5 times that of the initial display), and is made to correspond to areas $b_{22}$, $b_{32}$ and $b_{42}$ on the transparent touch panel 11D. If a switch $K_3$ has been used few times, it is displayed by, for example, an area $a_{61}$ on the display panel 15D (i.e., it is displayed by a size 0.5 times as that of the initial display), and is made to correspond to an area $b_{61}$ of the transparent touch panel 11D. In consequence, the operator can an operate the switch $K_5$ by pressing any portion of an area formed by the $b_{22}$, $b_{32}$ and $b_{42}$ on the transparent touch panel 15D. Thus, the frequently operated switches have an enlarged input area that can be touched with a finger of the operator and can thus be operated easily.

Figure 20:
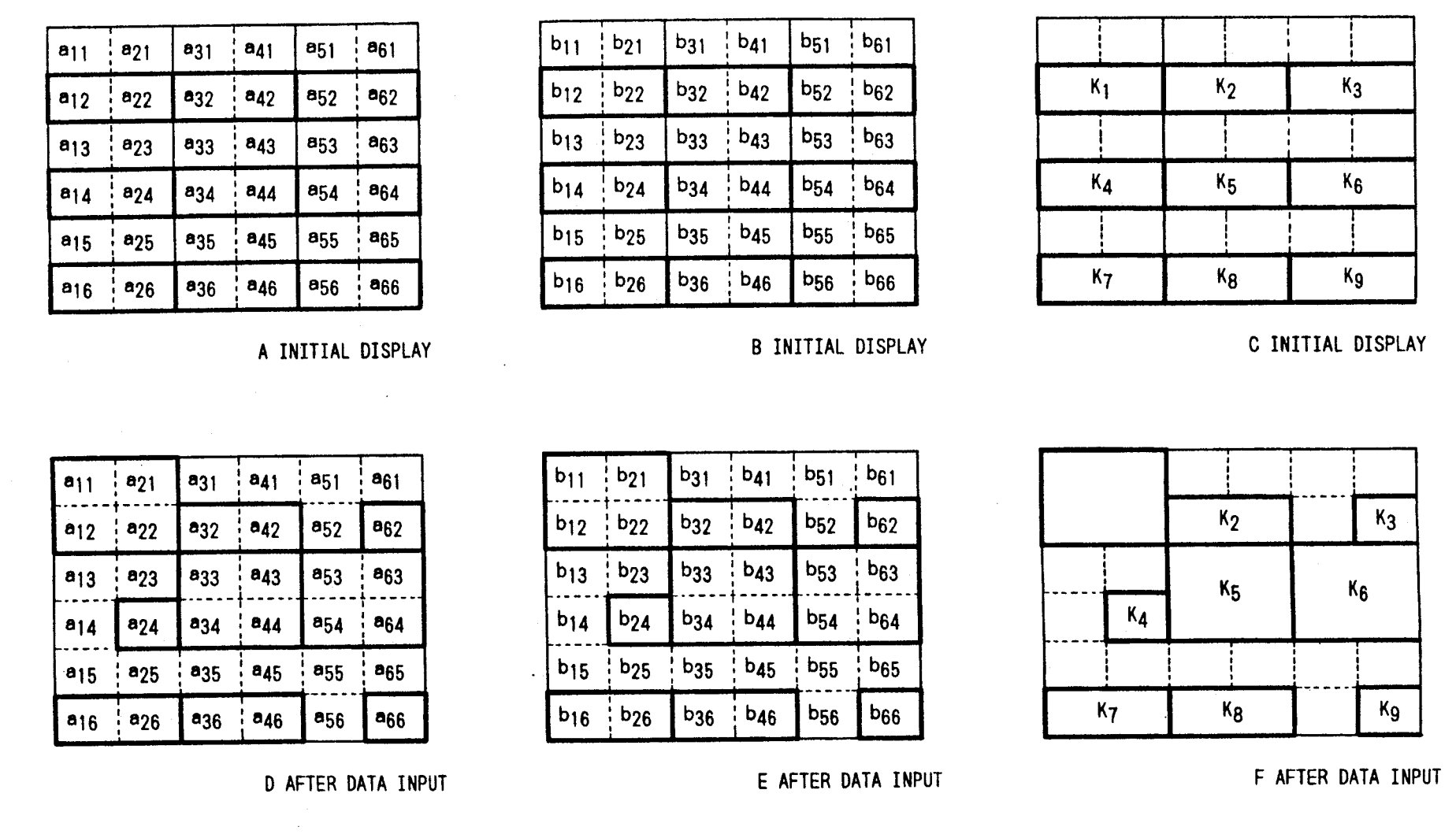

The fourth embodiment may also be operated in a manner shown in FIG. 20. That is, the display panel 15D is divided into 36 areas $a_{11}$ to $a_{66}$, and the transparent touch panel 11D is also divided into 36 areas $b_{11}$ to $b_{66}$. In an initial state shown in FIGS. 20A, 20B and 20C, a plurality of areas framed with thick lines are operated as switches, and when other portions are touched by a finger of the operator, a switch operation is not performed.

After switch operations have been conducted in a certain period of time, the framed areas are changed in a manner shown in, for example, FIGS. 20D, 20E and 20F.

An arrangement shown in FIG. 20 has an advantage in that an individual switch area can be enlarged independently even if all the adjacent switch areas have been enlarged.

In the above-described fourth embodiment, changes in the display formation or in the display sequence which are carried out in the first, second and third embodiments, are applicable. In consequence, not only the switch areas but also the arranging sequence thereof can be changed, as shown in FIG. 21. In this embodiment, it is assumed that the frequency with which the individual key switch is operated has an order expressed by $F_1 > F_5 > F_6 > F_2 > F_7 > F_8 > F_3 > F_4 > F_9$.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A transmitter for remote control comprising:
   switching means for inputting an operation instruction, including a plurality of operation switches;
   control means electrically connected to said switching means, said control means controlling generation of a remote control signal corresponding to an operation instruction which is inputted by said switching means;
   remote control signal generation means electrically connected to said control means, said remote control signal generation means being controlled by said control means such that it generates the remote control signal corresponding to said operation instruction which is inputted by said switching means and externally outputs the generated signal; and
   display means electrically connected to said control means, said display means displaying operation instruction images expressing the operation instructions in a form corresponding to the arrangement form of said plurality of operation switches of said switching means;
   said control means including:
   counting means for counting an input frequency of an individual operation instruction inputted into said switching means; and
   changing means for changing display formation of said operation instruction images displayed on said display means and/or an arrangement formation of said plurality of operation switches in said switching means in accordance with said input frequency.

2. A transmitter for remote control according to claim 1, wherein said counting means includes switch operation frequency counting means for counting the number of times when each individual operation switch in said plurality of operation switches is operated within a predetermined period of time, and said changing means includes display formation control means for changing a display formation of said operation instruction images displayed by said display means in accordance with said number of times.

3. A transmitter for remote control according to claim 1, wherein a display formation of said operation instruction images expressing remote control contents includes a shape, density, size, color, and/or sequence of said operation instruction images, and a combination thereof.

4. A transmitter for remote control according to claim 1, wherein said plurality of operation switches comprise transparent touch panel switches which are provided on said operation instruction images, and wherein said control means includes switch operation frequency counting means for counting the number of times when each individual switch in said plurality of operation switches is operated within a predetermined period of time, and input formation control means for changing the arrangement formation of said plurality of operation switches placed on the operation instruction images displayed by said display means in accordance with said number of times.

5. A transmitter for remote control according to claim 1, wherein the arrangement formation of said plurality of operation switches includes a shape and/or sequence of said operation switches, and a combination thereof.

6. A transmitter for remote control according to claim 2 or 4, wherein said control means includes switch operation frequency counting means having a timer and counter for said every operation switch and memory means for storing said number of times after each predetermined period of time has elapsed.

7. A transmitter for remote control according to claim 2 or 4, wherein said control means includes storage means for storing respective switch numbers of said plurality of operation switches operated within a fixed period of time by sequentially updating said switch numbers, said switch operation frequency counting means including a counter for totaling the numbers of frequency of occurrence of said switch numbers of said plurality of operation switches stored in said storage means for each switch, and said memory means including total memory means for storing a total of the numbers of said plurality of operation switches.

* * * * *